(12) United States Patent
Kawabata

(10) Patent No.: US 10,403,582 B2
(45) Date of Patent: *Sep. 3, 2019

(54) ELECTRONIC CIRCUIT PACKAGE USING COMPOSITE MAGNETIC SEALING MATERIAL

(71) Applicant: TDK Corporation, Tokyo (JP)

(72) Inventor: Kenichi Kawabata, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/805,150

(22) Filed: Nov. 7, 2017

(65) Prior Publication Data

US 2018/0374799 A1 Dec. 27, 2018

Related U.S. Application Data

(60) Provisional application No. 62/523,997, filed on Jun. 23, 2017.

(51) Int. Cl.
*H01L 23/52* (2006.01)
*H01L 23/552* (2006.01)
(Continued)

(52) U.S. Cl.
CPC .............. *H01L 23/552* (2013.01); *C08K 3/08* (2013.01); *H01F 1/14733* (2013.01); *H01L 21/4853* (2013.01); *H01L 21/4857* (2013.01); *H01L 21/561* (2013.01); *H01L 21/565* (2013.01); *H01L 21/78* (2013.01); *H01L 23/295* (2013.01); *H01L 23/3114* (2013.01); *H01L 23/5383* (2013.01); *C08K 2003/0806* (2013.01); *C08K 2003/0856* (2013.01);
(Continued)

(58) Field of Classification Search
CPC .................. C08K 3/08; C08K 2201/01; C08K 2003/0806; C08K 2003/0856; C08K 2003/0862; H01F 1/14733; H01L 23/295; H01L 21/4857; H01L 2224/16235; H01L 2924/186; H01L 2924/19105; H01L 2924/3025; H01L 2924/3511
See application file for complete search history.

(56) References Cited

U.S. PATENT DOCUMENTS

2001/0035579 A1    11/2001  Yoshida et al.
2002/0070446 A1*   6/2002   Horiuchi ............... H01L 21/568
                                                            257/723
(Continued)

FOREIGN PATENT DOCUMENTS

JP    59132196 A    7/1984
JP    01283900 A    11/1989
(Continued)

*Primary Examiner* — Moin M Rahman
(74) *Attorney, Agent, or Firm* — Young Law Firm, P.C.

(57) ABSTRACT

Disclosed herein is an electronic circuit package includes a substrate having a power supply pattern, an electronic component mounted on a surface of the substrate, and a composite molding member having conductivity that covers the surface of the substrate so as to embed the electronic component and that is connected to the power supply pattern. The composite molding member includes a resin material and a first filler blended in the resin material and containing 32 to 39 wt. % of a metal material composed mainly of Ni in Fe.

23 Claims, 13 Drawing Sheets

(51) Int. Cl.
　　　H01L 23/31　　　(2006.01)
　　　H01L 23/538　　(2006.01)
　　　H01L 21/56　　　(2006.01)
　　　H01L 21/48　　　(2006.01)
　　　H01L 21/78　　　(2006.01)
　　　H01F 1/147　　　(2006.01)
　　　C08K 3/08　　　 (2006.01)
　　　H01L 23/29　　　(2006.01)
　　　H01L 23/00　　　(2006.01)
(52) U.S. Cl.
　　　CPC .......... *C08K 2003/0862* (2013.01); *C08K 2201/001* (2013.01); *C08K 2201/01* (2013.01); *H01L 24/16* (2013.01); *H01L 24/32* (2013.01); *H01L 24/73* (2013.01); *H01L 24/97* (2013.01); *H01L 2224/16227* (2013.01); *H01L 2224/16235* (2013.01); *H01L 2224/32225* (2013.01); *H01L 2224/73204* (2013.01); *H01L 2224/97* (2013.01); *H01L 2924/15159* (2013.01); *H01L 2924/15192* (2013.01); *H01L 2924/15313* (2013.01); *H01L 2924/186* (2013.01); *H01L 2924/19041* (2013.01); *H01L 2924/19042* (2013.01); *H01L 2924/19105* (2013.01); *H01L 2924/3025* (2013.01); *H01L 2924/3511* (2013.01)

(56) References Cited

U.S. PATENT DOCUMENTS

| | | |
|---|---|---|
| 2005/0045358 A1 | 3/2005 | Arnold |
| 2009/0321923 A1 | 12/2009 | Swaminathan |
| 2011/0229708 A1* | 9/2011 | Asami .................. H01L 23/295 |
| | | 428/316.6 |
| 2012/0211846 A1* | 8/2012 | Li .......................... H01L 23/552 |
| | | 257/421 |
| 2014/0027171 A1* | 1/2014 | Song ..................... H05K 9/0024 |
| | | 174/377 |

FOREIGN PATENT DOCUMENTS

| | | |
|---|---|---|
| JP | 02078299 A | 3/1990 |
| JP | 05-005162 A | 1/1993 |
| JP | 10064714 A | 3/1998 |
| JP | H11214592 A | 8/1999 |
| JP | 2001237586 A | 8/2001 |
| JP | 2005-347449 A | 12/2005 |
| JP | 2010087058 A | 4/2010 |

\* cited by examiner

ELECTRONIC CIRCUIT PACKAGE USING COMPOSITE MAGNETIC SEALING MATERIAL

BACKGROUND OF THE INVENTION

Field of the Invention

The present invention relates to an electronic circuit package and, more particularly, to an electronic circuit package using a composite magnetic sealing material.

Description of Related Art

In recent years, an electronic device such as a smartphone is equipped with a high-performance radio communication circuit and a high-performance digital chip, and an operating frequency of a semiconductor IC used therein tends to increase. Further, adoption of an SIP (System-In Package) having a 2.5D or 3D structure, in which a plurality of semiconductor ICs are connected by a shortest wiring, is accelerated, and modularization of a power supply system is expected to accelerate. Further, an electronic circuit module having a large number of modulated electronic components (collective term of components, such as passive components (an inductor, a capacitor, a resistor, a filter, etc.), active components (a transistor, a diode, etc.), integrated circuit components (an semiconductor IC, etc.) and other components required for electronic circuit configuration) is expected to become more and more popular, and an electronic circuit package which is a collective term for the above SIP, electronic circuit module, and the like tends to be mounted in high density along with sophistication, miniaturization, and thinning of an electronic device such as a smartphone. However, this tendency poses a problem of malfunction and radio disturbance due to noise. The problem of malfunction and radio disturbance is difficult to be solved by conventional noise countermeasure techniques. Thus, recently, self-shielding of the electronic circuit package has become accelerated, and an electromagnetic shielding using a conductive paste or a plating or sputtering method has been proposed and put into practical use, and higher shielding characteristics are required in the future.

To achieve this, recently, there are proposed electronic circuit packages in which a molding material itself has magnetic shielding characteristics. For example, Japanese Patent Application Laid-Open No. H10-64714 discloses a composite magnetic sealing material added with soft magnetic powder having an oxide film as a molding material for electronic circuit package.

However, conventional composite magnetic sealing materials have a drawback in that it has a large thermal expansion coefficient. Thus, a mismatch occurs between a composite magnetic sealing material and a package substrate or electronic components in terms of the thermal expansion coefficient. As a result, an aggregated substrate having a strip shape after molding may be greatly warped, or there may occur a warp large enough to cause a problem with connectivity of an electronic circuit package in a diced state in mounting reflow. This phenomenon will be described in detail below.

In recent years, various structures have been proposed for and actually put into practical use as a semiconductor package or an electronic component module, and, currently, there is generally adopted a structure in which electronic components such as semiconductor ICs are mounted on an organic multilayer substrate, followed by molding of the upper portion and periphery of the electronic component package by a resin sealing material. A semiconductor package or electronic component module having such a structure is molded as an aggregated substrate, followed by dicing.

In this structure, an organic multilayer substrate and a resin sealing material having different physical properties constitute a so-called bimetal, so that a warp may occur due to the difference between thermal expansion coefficients, glass transition, or curing shrinkage of a molding material. To suppress the warp, it is necessary to make the physical properties such as thermal expansion coefficients coincide with each other as much as possible. In recent years, an organic multilayer substrate used for a semiconductor package or an electronic circuit module is getting thinner and thinner and is increasing in the number of layers thereof to meet requirements for height reduction. In order to realize high rigidity and low thermal expansion for ensuring good handleability of a thin substrate while achieving the thickness reduction and multilayer structure, use of a substrate material having a high glass transition temperature, addition of a filler having a small thermal expansion coefficient to a substrate material, or use of glass cloth having a smaller thermal expansion coefficient is a common practice at present.

On the other hand, the difference in physical properties between semiconductor ICs and electronic components mounted on a substrate and a molding material also generates a stress, causing various problems such as interfacial delamination of the molding material and crack of the electronic components or molding material. Incidentally, silicon is used as the semiconductor ICs. The thermal expansion coefficient of silicon is 3.5 ppm/° C., and that of a baked chip component such as a ceramic capacitor or an inductor is about 10 ppm/° C.

Thus, the molding material is also required to have a small thermal expansion coefficient, and some commercially-available materials have a thermal expansion coefficient below 10 ppm/° C. As a method for reducing the thermal expansion coefficient of the molding material, adopting an epoxy resin having a small thermal expansion coefficient, as well as, blending fused silica having a very small thermal expansion coefficient of 0.5 ppm/° C. in a sealing resin at a high filling rate can be taken.

General magnetic materials have a high thermal expansion coefficient. Thus, as described in Japanese Patent Application Laid-Open No. H10-64714, the composite magnetic sealing material obtained by adding general soft magnetic powder to a mold resin cannot achieve a target small thermal expansion coefficient.

Japanese Patent Application Laid-Open No. S59-132196 discloses an electronic circuit package whose shielding characteristics are enhanced by molding an electronic circuit using a magnetic mold resin and covering the entire structure with a metal casing.

However, in the electronic circuit package disclosed in Japanese Patent Application Laid-Open No. S59-132196, the covering of the entire structure with the metal casing makes reduction in height difficult. Further, the metal casing has a large number of holes formed therein and is not connected to a ground pattern of a substrate, so that a sufficient shielding effect cannot be obtained.

SUMMARY

It is therefore an object of the present invention to provide an electronic circuit package using a composite magnetic sealing material having a low thermal expansion coefficient as a molding material.

Another object of the present invention is to provide an electronic circuit package capable of obtaining high shielding characteristics while achieving reduction in height.

An electronic circuit package according to the present invention includes a substrate having a power supply pattern, an electronic component mounted on a surface of the substrate, and a composite molding member having conductivity that covers the surface of the substrate so as to embed the electronic component and that is connected to the power supply pattern. The composite molding member includes a resin material and a first filler blended in the resin material and containing 32 to 39 wt. % of a metal material composed mainly of Ni in Fe.

According to the present invention, by using the first filler having a low thermal expansion coefficient, it is possible to significantly reduce the thermal expansion coefficient of the molding member formed of a composite magnetic sealing material to, e.g., 15 ppm/° C. or less. This can prevent warpage of the substrate, interfacial peeling in the molding material, cracking of the molding material, and the like. Further, the molding member has both conductivity and magnetism, so that it is possible to obtain a composite shielding structure having both an electromagnetic shielding function and a magnetic shielding function by the molding member itself.

In the present invention, the surface of the first filler may be covered with a metal coating having higher conductivity than that of the first filler. With this configuration, it is possible to reduce the volume resistance of the composite molding member.

In the present invention, the composite molding member may further include a second filler having a smaller size than that of the first filler. In this case, the surface of the second filler may be covered with a metal coating. With this configuration, it is possible to further reduce the volume resistance of the composite molding member.

In the present invention, the second filler may be formed of a magnetic material, a conductive material, or an insulating material.

In the present invention, the blending ratio of the first and second fillers in the composite molding member may be equal to or higher than 50 vol. % and equal to or lower than 85 vol. %. Further, the blending ratio of the first filler to the total filler of the first and second fillers may be equal to or higher than 50 vol. % and equal to or lower than 99 vol. %.

The electronic circuit package according to the present invention may further include an insulating coating that insulates the electronic component and its terminal electrode from the composite molding member. With this configuration, it is possible to prevent a faulty short-circuit between the electronic component and the composite molding member.

In the present invention, the composite molding member may contact the power supply pattern exposed to the surface of the substrate or may contact the power supply pattern exposed to the side surface of the substrate.

In the present invention, the side surface of the substrate may include a side surface upper part and a side surface lower part protruding from the side surface upper part. The power supply pattern may be exposed to the side surface upper part of the substrate. The composite molding member may cover the side surface upper part of the substrate without covering the side surface lower part of the substrate. With the above configuration, it is possible to connect the composite molding member to the power supply pattern exposed to the side surface of the substrate before substrate individuation.

The electronic circuit package according to the present invention may further include a metal film that covers the composite molding member and has higher conductivity than that of the composite molding member. With this configuration, it is possible to further enhance electromagnetic shielding characteristics.

The electronic circuit package according to the present invention may further include a magnetic film that covers the composite molding member and has higher permeability than that of the composite molding member. With this configuration, it is possible to further enhance magnetic shielding characteristics.

In the present invention, the metal material may further include 0.1 to 8 wt. % of Co relative to the total weight of the first filler. With this configuration, it is possible to further reduce the thermal expansion coefficient of a magnetic molding resin formed of the composite magnetic sealing material.

In the present invention, the thickness of the composite molding member at a portion above the electronic component may be equal to or larger than 50 μm, or equal to or larger than 100 μm and equal to or smaller than 300 μm. With this configuration, it is possible to obtain higher shielding characteristics than in a case where the surface of a general molding member is shielded by a metal film as well as to achieve reduction in height.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

<First Embodiment>

Figure 1:
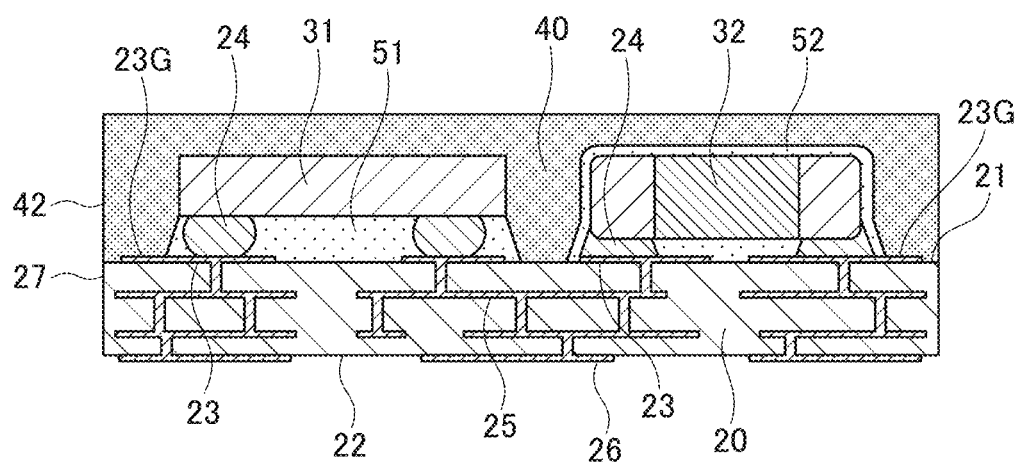
FIG. 1 is a cross-sectional view illustrating a configuration of an electronic circuit package according to a first embodiment of the present invention.

FIG. 1 is a cross-sectional view illustrating a configuration of an electronic circuit package 11 according to the first embodiment of the present invention.

As illustrated in FIG. 1, the electronic circuit package 11 according to the present embodiment includes a substrate 20, a plurality of electronic components 31 and 32 mounted on the substrate 20, and a composite molding member 40 having a conductivity covering a front surface 21 of the substrate 20 so as to embed the electronic components 31 and 32.

Although the type of the electronic circuit package 11 according to the present embodiment is not especially limited, examples thereof include a high-frequency module handling a high-frequency signal, a power supply module performing power supply control, an SIP (System-In-Package) having a 2.5D structure or a 3D structure, and a semiconductor package for radio communication or digital circuit. Although only two electronic components 31 and 32 are illustrated in FIG. 1, more electronic components are incorporated actually.

The substrate 20 has a double-sided and multilayer wiring structure in which a large number of wirings are embedded therein and may be any type of substrate including: a thermosetting resin based organic substrate such as an FR-4, an FR-5, a BT, a cyanate ester substrate, a phenol substrate, or an imide substrate; a thermoplastic resin based organic substrate such as a liquid crystal polymer; an LTCC substrate; an HTCC substrate; and a flexible substrate. In the present embodiment, the substrate 20 has a four-layer structure including wiring layers formed on the front surface 21 and a back surface 22 and two wiring layers embedded therein. Land patterns 23 are an internal electrode for connecting to the electronic components 31 and 32. The land patterns 23 and each of the electronic components 31 and 32 are electrically and mechanically connected to each other through a respective solder 24 (or a conductive paste). For example, the electronic component 31 is a semiconductor chip such as a controller, and electronic component 32 is a passive component such as a capacitor or a coil. Some electronic components (e.g., thinned semiconductor chip) may be embedded in the substrate 20.

The land patterns 23 are connected to external terminals 26 formed on the back surface 22 of the substrate 20 through internal wirings 25 formed inside the substrate 20. Upon actual use, the electronic circuit package 11A is mounted on an unillustrated mother board, and land patterns on the mother board and the external terminals 26 of the electronic circuit package 11A are electrically connected. A material for a conductor forming the land patterns 23, internal wirings 25, and external terminals 26 may be a metal such as copper, silver, gold, nickel, chrome, aluminum, palladium, indium, or a metal alloy thereof or may be a conductive material using resin or glass as a binder; however, when the substrate 20 is an organic substrate or a flexible substrate, copper or silver is preferably used in terms of cost and conductivity. The above conductive materials may be formed by using various methods such as printing, plating, foil lamination, sputtering, vapor deposition, and inkjet. In addition, a low-resistance metal such as Au, Pd, Ag, Sn, and the like may be formed on the land patterns 23 by means of plating, spattering, evaporating, and the like, or an antioxidizing film such as Cu—OSP and the like may be formed on the land patterns 23.

The electronic components 31, 32, and their terminal electrodes and the solders 24 are covered with insulating coatings 51 and 52, respectively, and thereby insulated from the composite molding member 40. Although the insulating coating 51 is provided between the electronic component 31 and the substrate 20 in the example of FIG. 1, it may be provided so as to cover the entire electronic component 31. On the other hand, the insulating coating 52 is provided so as to cover the entire electronic component 32.

As illustrated in FIG. 1, a power supply pattern 23G led out from the land pattern 23 is exposed without being covered with the insulating coating 51 or 52 and contacts the composite molding member 40. The power supply pattern 23G is typically a ground pattern to which a ground potential is applied, but not limited thereto as long as it is a pattern to which a fixed potential is applied.

The composite molding member 40 covers the front surface 21 of the substrate 20 so as to embed the electronic components 31 and 32 therein. The composite molding member 40 has a conductivity and high permeability. Thus, the composite molding member 40 serves as an electromagnetic shielding and a magnetic shielding in addition to an ordinary function of a molding member. In the present embodiment, a side surface 42 of the composite molding member 40 and a side surface 27 of the substrate 20 form the same plane. Although details of the composite molding member 40 are described later, the composite molding member 40 is made of a composite material having very small thermal expansion coefficient (equal to or lower than 15 ppm/° C., for example) compared with an ordinary molding material.

The following describes a manufacturing method for the electronic circuit package 11 according to the present embodiment.

FIGS. 2 to 6 are process views for explaining a manufacturing method for the electronic circuit package 11.

Figure 2:
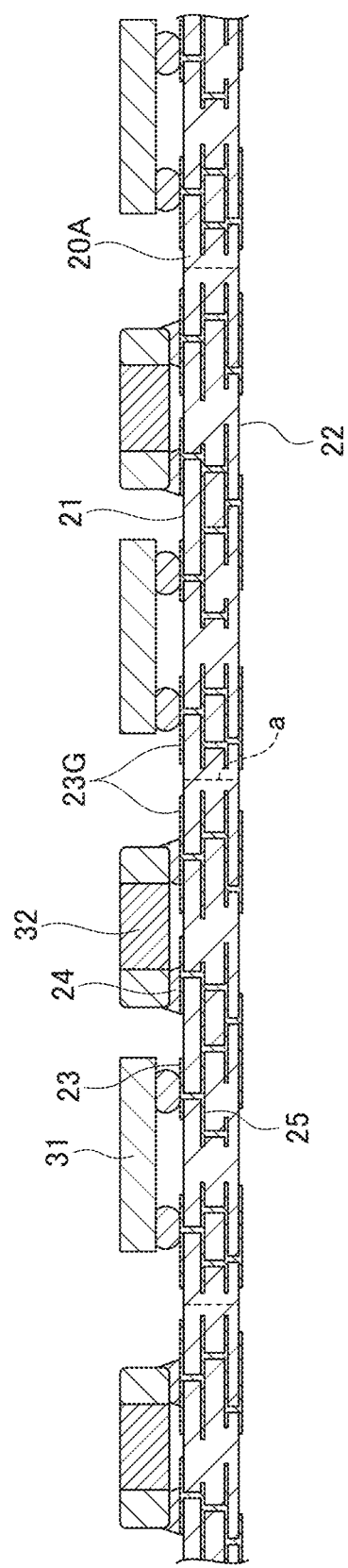
FIGS. 2 to 6 are process views for explaining a manufacturing method for the electronic circuit package shown in FIG. 1.

As illustrated in FIG. 2, an assembly substrate 20A having a multilayer wiring structure is prepared. A plurality of the land patterns 23 and a plurality of the ground patterns 23G are formed on the front surface 21 of the assembly substrate 20A, and a plurality of the external terminals 26 are formed on the back surface 22 of the assembly substrate 20A. Further, a plurality of the internal wirings 25 are formed in an inner layer of the assembly substrate 20A. A dashed line a in FIGS. 2 to 5 denotes a part to be cut in a subsequent dicing process.

Then, as illustrated in FIG. 2, the plurality of electronic components 31 and 32 are mounted on the front surface 21 of the assembly substrate 20A so as to be connected to the land patterns 23. Specifically, the solder 24 is provided on the land pattern 23, followed by mounting of the electronic components 31 and 32 and by reflowing, whereby the electronic components 31 and 32 are connected to the land patterns 23.

Figure 3:
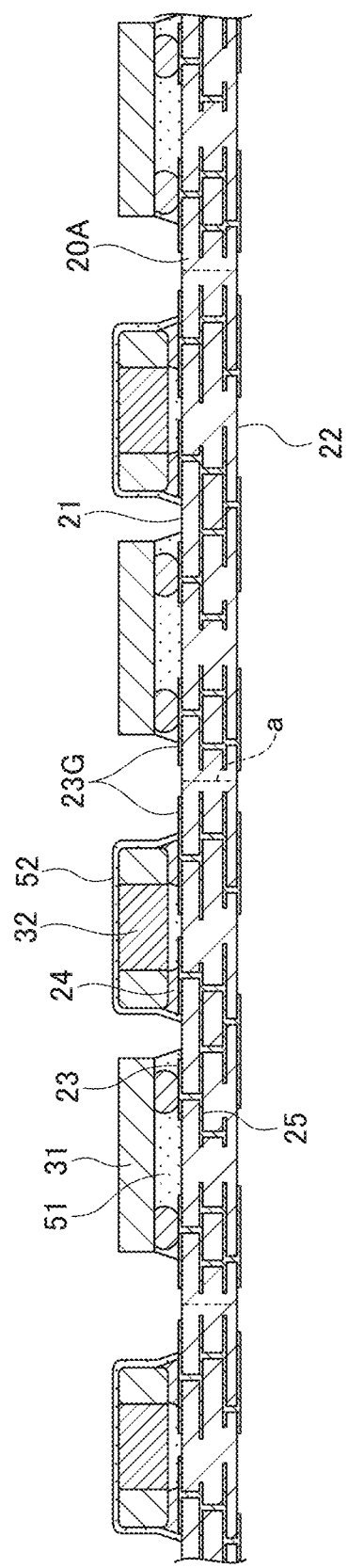

Then, as illustrated in FIG. 3, the electronic components 31, 32, and the terminal electrodes and solders 24 of the respective electronic components 31, 32 are covered with the insulating coatings 51 and 52, respectively. At this time, at least a part of the power supply pattern 23G needs to be exposed without being covered with the insulating coating 51 or 52.

Figure 4:
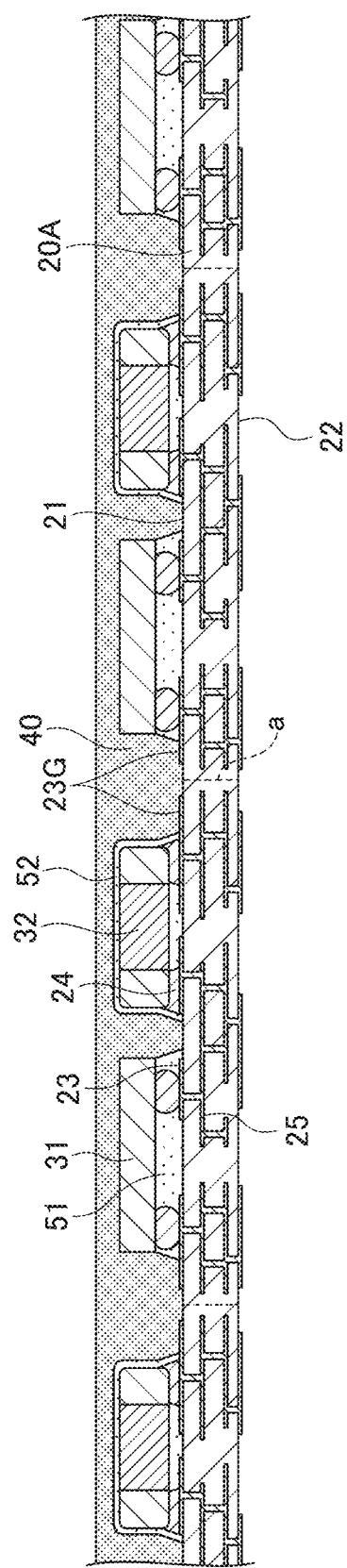
Figure 5:
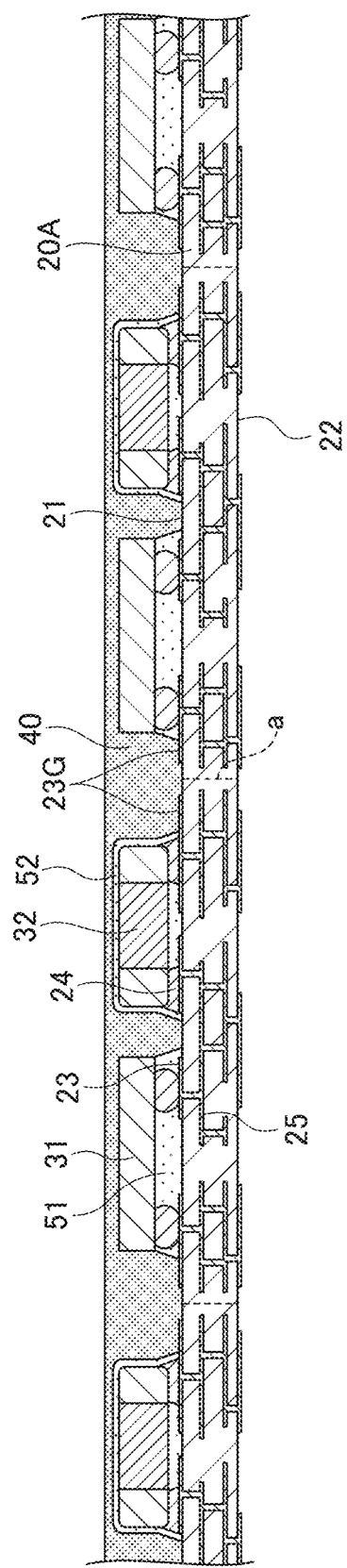

Then, as illustrated in FIG. 4, the composite molding member 40 is used to cover the surface 21 of the aggregate substrate 20A so as to embed the electronic components 31 and 32 therein. A formation method for the composite molding member 40 includes transfer molding, compression molding, injection molding, cast molding, vacuum cast molding, dispensing, and a method using a slit nozzle. Thereafter, as illustrated in FIG. 5, the upper surface of the composite molding member 40 is polished to adjust the thickness of the composite molding member 40. Although the thickness of the composite molding member 40 is not particularly limited, the thickness of the composite molding member 40 at a portion above the tallest electronic component among all the electronic components including the electronic components 31 and 32 is preferably equal to or larger than 50 μm and more preferably equal to or larger than 100 μm. This can sufficiently reduce volume resistivity of the composite molding member 40. However, in the present invention, polishing of the upper surface of the composite molding member 40 is optional.

Figure 6:
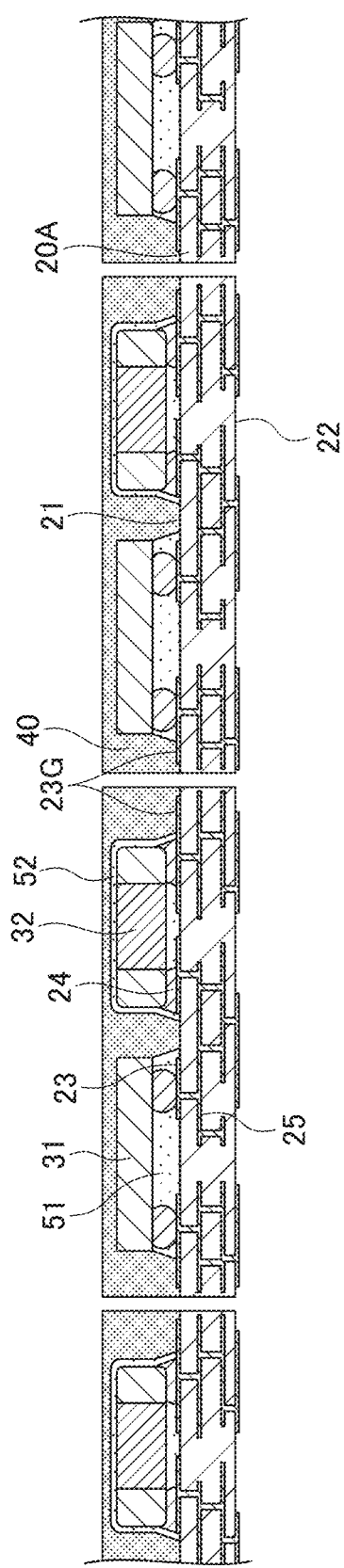

Then, as illustrated in FIG. 6, the aggregate substrate 20A is cut along the dashed lines a into individual substrates 20, whereby the electronic circuit package 11 according to the present embodiment is completed.

Next, a molding material constituting the composite molding member 40 will be described in detail.

The molding material constituting the composite molding member 40 has magnetism and conductivity unlike general molding materials. The composite molding member 40 is connected to the power supply pattern 23G and is thus applied with a fixed potential such as a ground potential. As a result, a composite shielding structure having both a magnetic shielding function and an electromagnetic shielding function can be provided.

The composite molding member 40 includes a binder and a first filler having magnetism and conductivity. Although not especially limited, the resin binder preferably composed mainly of a thermosetting resin material. Specifically, the binder is preferably composed mainly of an epoxy resin, a phenol resin, a urethane resin, a silicone resin, or an imide resin and more preferably uses a base resin and a curing agent used for an epoxy resin-based or a phenol resin-based semiconductor sealing material.

The most preferable is the epoxy resin having a reactive epoxy group at its terminal, which can be combined with various types of curing agents and curing accelerators. Examples of the epoxy resin include a bisphenol A epoxy resin, a bisphenol F epoxy resin, a phenoxy type epoxy resin, a naphthalene type epoxy resin, a multifunctional-type epoxy resin (dicyclopentadiene type epoxy resin, etc.), a biphenyl-type (bifunctional) epoxy resin, and an epoxy resin having a special structure. Among them, the biphenyl type epoxy resin, naphthalene type epoxy resin, and dicyclopentadiene type epoxy resin are useful since they can attain low thermal expansion. Examples of the curing agent or curing accelerator include amine-based compound alicyclic diamine, aromatic diamine, other amine-based compounds (imidazole, tertiary amine, etc.), an acid anhydride compound (high-temperature curing agent, etc.), a phenol resin (novolac type phenol resin, cresol novolac type phenol resin, etc.), an amino resin, dicyandiamide, and a Lewis acid complex compound. For material kneading, known means such as a kneader, three-roll mills, or a mixer may be used.

Figure 7:
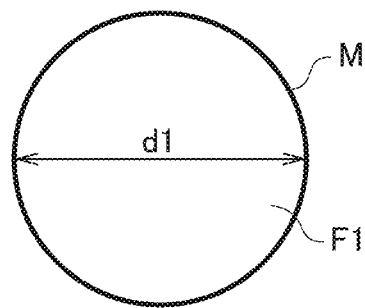
FIG. 7 is a cross-sectional view for explaining a structure of a first filler.

FIG. 7 is a cross-sectional view illustrating an example of the first filler F1. It is preferable that the first filler F1 has a median diameter (D50) of d1 and that the surface thereof is applied with a metal coating M having higher conductivity than that of the first filler F1. Applying the metal coating M to the surface of the first filler F1 allows volume resistivity of the composite molding member 40 to be reduced further. The metal coating M is mainly composed of Au, Ag, Al, Mg, W, Mo, Zn, Ni, Fe, Pt, Pd, Sn, or Cu. The thickness of the metal coating M to be formed on the first filler F1 is preferably in a range of 1 nm to 3000 nm.

The first magnetic filler F1 is formed of an Fe—Ni based material and contains 32 to 39 wt. % of a soft magnetic metal material composed mainly of Ni. The remaining 61 to 68 wt. % is Fe. Such an Fe—Ni based material is called "Invar material". Using the Invar material for the first filler F1 can make the thermal expansion coefficient of the composite molding member 40 be equal to or less than, e.g., 15 ppm/° C. and can achieve high magnetic characteristics. The soft magnetic metal material composed of mainly Ni may contain a small amount of Co. That is, a part of Ni may be substituted for Co. The containing of Co enables a further reduction in the thermal expansion coefficient of the composite magnetic sealing material. The adding amount of Co to the total weight of the first filler F1 is preferably 0.1 wt. % or more and 8 wt. % or less.

The shape of the first filler F1 is not especially limited. However, the magnetic filler 6 may preferably be formed into a spherical shape for high packing density. Further, fillers of different particle sizes may be blended as the first filler F1 for closest packing. Further, forming the first filler F1 into a spherical shape or substantially a spherical shape enables a reduction in damage to electronic components during molding. Particularly, for high packing density or closest packing, the shape of the first filler F1 is preferably a true sphere. The first filler F1 preferably has a high tap density and a small specific surface area. As a formation method for the first filler F1, there are known a water atomization method, a gas atomization method, and a centrifugal disc atomization method. Among them, the gas atomization method is most preferable since it can achieve a high tap density and reduce the specific surface area.

The composite molding member 40 may contain, in addition to the first filler F1, a second filler F2a (FIG. 8A) formed of a magnetic material, a second filler F2b (FIG. 8B) formed of a conductive material, or a second filler F2c (FIG. 8C) formed of an insulating material. The median diameters d2 of the respective second fillers F2a, F2b, and F2c are smaller than the median diameter d1 of the first filler F1. This can increase the filling rate of the filler contained in the composite molding member 40. The surfaces of the respective second fillers F2a, F2b, and F2c are also each preferably covered with the metal coating M. This can reduce the volume resistivity of the composite molding member 40. The material and thickness of the metal coating M may be the same as those of the metal coating M to be applied to the first filler F1. The blending ratio of the total filler including the first filler F1 and the second filler F2a, F2b, or F2c to the binder is preferably 50 vol. % to 85 vol. %. Further, the blending ratio of the first filler F1 to the total filler is preferably 50 vol. % to 99 vol. %.

Figure 8A:
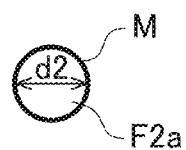
FIGS. 8A to 8C are cross-sectional views for explaining a structure of a second filler.

The second filler F2a illustrated in FIG. 8A is formed of a magnetic material. The magnetic material may be composed of at least one material selected from a group consisting of Fe, an Fe—Co based alloy, an Fe—Ni based alloy, an Fe—Al based alloy, an Fe—Si based alloy, an Ni—Zn based spinel ferrite, an Mn—Zn based spinel ferrite, an Ni—Cu—Zn based spinel ferrite, an Mg based spinel ferrite, and an yttrium iron based garnet ferrite. The material of the second filler F2a may be the same as that of the first filler F1. The thickness of the metal coating M to be formed on the second filler F2a is preferably in a range of 1 nm to 2000 nm.

Figure 8B:
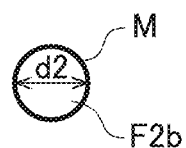

The second filler F2b illustrated in FIG. 8B is formed of a conductive material. The conductive material may be composed of mainly Au, Ag, Al, Mg, W, Mo, Zn, Ni, Fe, Pt, Pd, Sn, or Cu. Even when the conductive material is used as the material of the second filler F2b, the surface of the second filler F2b may be covered with the metal coating M.

Figure 8C:
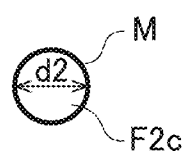

The second filler F2c illustrated in FIG. 8C is formed of an insulating material. The insulating material may be composed of fused silica, calcium carbonate, magnesium oxide, aluminum oxide, titanium oxide, or a heat resistant resin. The heat resistant resin may be a thermosetting resin or a thermoplastic resin. Particularly, a material having a smaller thermal expansion coefficient than that of the first filler F1, such as $SiO_2$, $ZrW_2O_8$, $(ZrO)_2P_2O_7$, $KZr_2(PO_4)$, or $KZr_2(WO_4)(PO_4)_2$, or a material having a negative thermal expansion coefficient is preferably used. When the above second filler F2c is added to the composite molding member 40, it is possible to further reduce the thermal expansion coefficient. Further, the following materials may be added: flame retardant such as aluminum oxide or magnesium oxide; carbon black, pigment, or dye for coloring; surface-treated nanosilica having a particle diameter of 100 nm or less for enhancement of slidability, flowability, and dispersibility/kneadability; and a wax component for enhancement of mold releasability. The thickness of the metal coating M to be formed on the second filler F2c is preferably in a range of 1 nm to 2000 nm. In the present invention, the composite material constituting the composite molding member 40 need not necessarily contain the second filler (F2a, F2b, or F2c).

The composite material constituting the composite molding member 40 may be a liquid or solid, depending on selection of a base resin and a curing agent according to the molding method therefor. The composite material in a solid state may be formed into a tablet shape for transfer molding and into a granular shape for injection molding or compression molding. The molding method using the composite material may be appropriately selected from among the followings: transfer molding; compression molding; injection molding; cast molding; vacuum cast molding; vacuum printing; printing; dispensing; and a method using a slit nozzle. A molding condition may be appropriately selected from combinations of the base resin, curing agent and curing accelerator to be used. Further, after-cure treatment may be applied as needed after the molding.

As described above, in the electronic circuit package 11 according to the present embodiment, the composite molding member 40 has conductivity, so that the composite molding member 40 itself functions as an electromagnetic shield for the electronic circuit package 11. As a result, electromagnetic waves emitted from the electronic components 31 and 32 or electromagnetic waves coming from the outside are converted into a current inside the composite molding member 40 to be made to flow outside through the power supply pattern 23G. Further, the first filler F1 contained in the composite molding member 40 is formed of an Invar material, it is therefore possible to prevent warpage of the substrate, interfacial peeling in the molding material, cracking of the molding material, and the like due to a temperature change while ensuring magnetic shielding characteristics.

<Second Embodiment>

Figure 9:
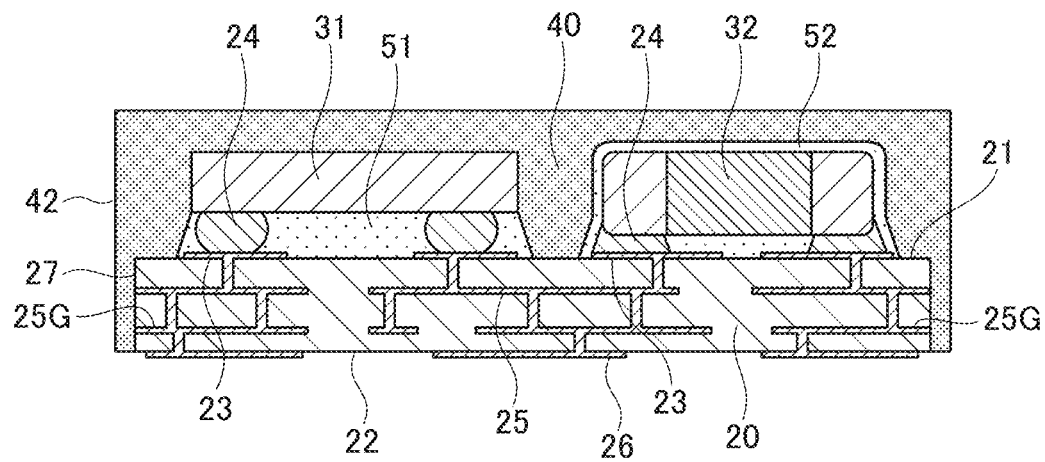
FIG. 9 is a cross-sectional view illustrating a configuration of an electronic circuit package according to a second embodiment of the present invention.

FIG. 9 is a cross-sectional view illustrating the configuration of an electronic circuit package 12 according to the second embodiment of the present invention.

As illustrated in FIG. 9, in the electronic circuit package 12 according to the present embodiment, the planar size of the composite molding member 40 is slightly larger than the planar size of the substrate 20 and, thus, the side surface 27 of the substrate 20 is covered with the composite molding member 40. To the side surface 27 of the substrate 20, a power supply pattern 25G constituting a part of an internal wiring 25 is exposed, and the exposed power supply pattern 25G and the composite molding member 40 contact each other. As a result, the composite molding member 40 is applied with a fixed potential (typically, a ground potential) through the power supply pattern 25G. In the present embodiment, the power supply pattern 23G is not provided on the surface 21 of the substrate 20, or even when the power supply pattern 23G is provided, it is covered with the insulating coatings 51 and 52, with the result that the power supply pattern 23G and the composite molding member 40 do not contact each other. Other configurations are the same as those of the electronic circuit package 11 according to the first embodiment, so the same reference numerals are given to the same elements, and overlapping description will be omitted.

In the electronic circuit package 12 according to the present embodiment, the power supply pattern 25G exposed to the side surface 27 of the substrate 20 and the composite molding member 40 contact each other, so that the power supply pattern 23G need not be exposed to the surface 21 of the substrate 20. As a result, for example, the insulating coatings 51 and 52 can be formed on the entire surface of the surface 21 of the substrate 20, thereby simplifying the manufacturing process.

The electronic circuit package 12 according to the present embodiment can be manufactured by cutting the aggregate substrate 20A into individual substrates 20 and then forming the composite molding member 40 on the upper and side surfaces 21 and 27 of the substrate 20.

<Third Embodiment>

Figure 10:
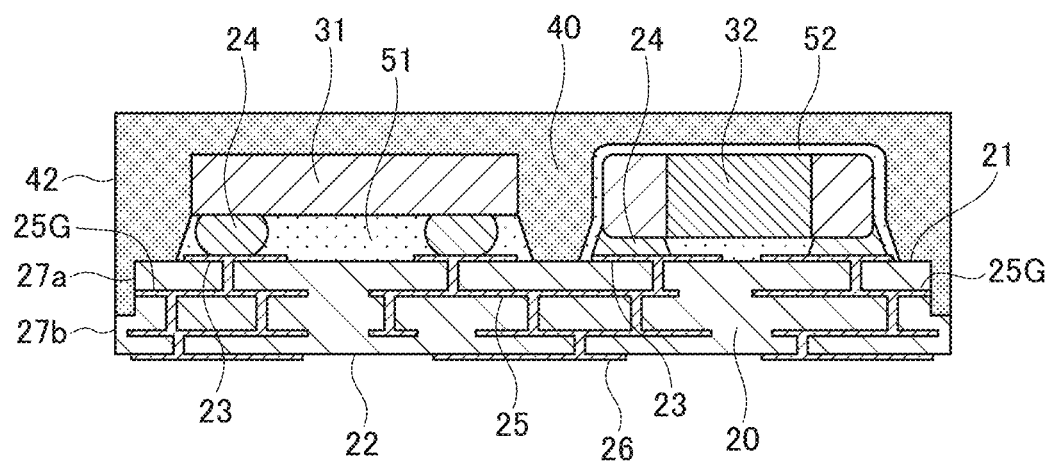
FIG. 10 is a cross-sectional view illustrating a configuration of an electronic circuit package according to a third embodiment of the present invention.

FIG. 10 is a cross-sectional view illustrating the configuration of an electronic circuit package 13 according to the third embodiment of the present invention.

As illustrated in FIG. 10, in the electronic circuit package 13 according to the present embodiment, the side surface 27 of the substrate 20 is formed into a step shape. Specifically, the side surface 27 has a shape in which a side surface lower part 27b protrudes from a side surface upper part 27a. To the side surface upper part 27a, the power supply pattern 25G is exposed, and the exposed power supply pattern 25G and the composite molding member 40 contact each other. The power supply pattern 25G is not exposed to the side surface lower part 27b, and the side surface lower part 27b and a side surface 42 of the composite molding member 40 constitute the same plane. Other configurations are the same as those of the electronic circuit package 12 according to the second embodiment, so the same reference numerals are given to the same elements, and overlapping description will be omitted.

In the electronic circuit package 13 according to the present embodiment, the power supply pattern 25G exposed to the side surface upper part 27a of the substrate 20 and the composite molding member 40 contact each other, so that the power supply pattern 23G need not be exposed to the surface 21 of the substrate 20. As a result, as in the second embodiment, the insulating coatings 51 and 52 can be formed on the entire surface of the surface 21 of the substrate 20, thereby simplifying the manufacturing process.

The electronic circuit package 13 according to the present embodiment can be manufactured by forming a groove constituting the side surface upper part 27a in the aggregate substrate 20A, then forming the composite molding member 40 in the upper surface 21 of the substrate 20 so as to fill the groove therewith, and afterwards cutting the aggregate substrate 20A into individual substrates 20.

<Fourth Embodiment>

Figure 11:
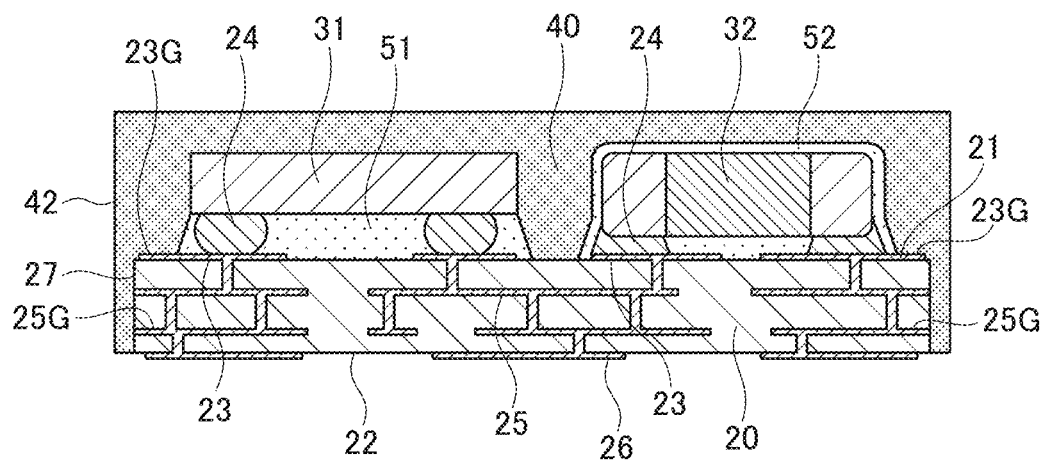
FIG. 11 is a cross-sectional view illustrating a configuration of an electronic circuit package according to a fourth embodiment of the present invention.

FIG. 11 is a cross-sectional view illustrating the configuration of an electronic circuit package 14 according to the fourth embodiment of the present invention.

As illustrated in FIG. 11, the electronic circuit package 14 according to the present embodiment differs from the electronic circuit package 12 according to the second embodiment in that the power supply pattern 23G provided on the surface 21 of the substrate 20 and the composite molding member 40 contact each other. Other configurations are the same as those of the electronic circuit package 12 according to the second embodiment, so the same reference numerals are given to the same elements, and overlapping description will be omitted.

In the electronic circuit package 14 according to the present embodiment, the composite molding member 40 is connected to the power supply patterns 23G and 25G at both the upper and side surfaces 21 and 27 of the substrate 20, so that it is possible to make the potential (typically, a ground potential) of the composite molding member 40 more stable than in the electronic circuit package 12 according to the second embodiment.

<Fifth Embodiment>

Figure 12:
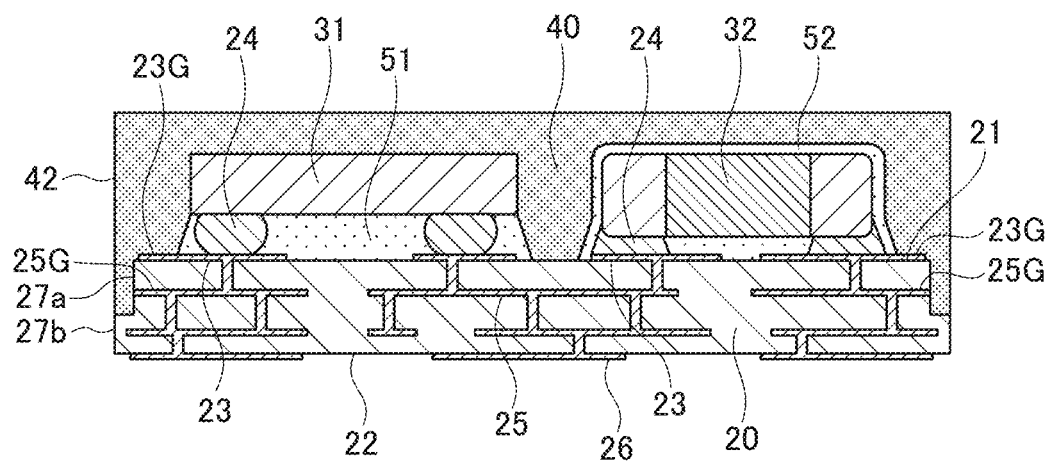
FIG. 12 is a cross-sectional view illustrating a configuration of an electronic circuit package according to a fifth embodiment of the present invention.

FIG. 12 is a cross-sectional view illustrating the configuration of an electronic circuit package 15 according to the fifth embodiment of the present invention.

As illustrated in FIG. 12, the electronic circuit package 15 according to the present embodiment differs from the electronic circuit package 13 according to the third embodiment in that the power supply pattern 23G provided on the surface 21 of the substrate 20 and the composite molding member 40 contact each other. Other configurations are the same as those of the electronic circuit package 13 according to the third embodiment, so the same reference numerals are given to the same elements, and overlapping description will be omitted.

In the electronic circuit package 15 according to the present embodiment, the composite molding member 40 is connected to the power supply patterns 23G and 25G at both the upper surface 21 and the side surface upper part 27a of the substrate 20, so that it is possible to make the potential (typically, a ground potential) of the composite molding member 40 more stable than in the electronic circuit package 13 according to the third embodiment.

<Sixth Embodiment>

Figure 13:
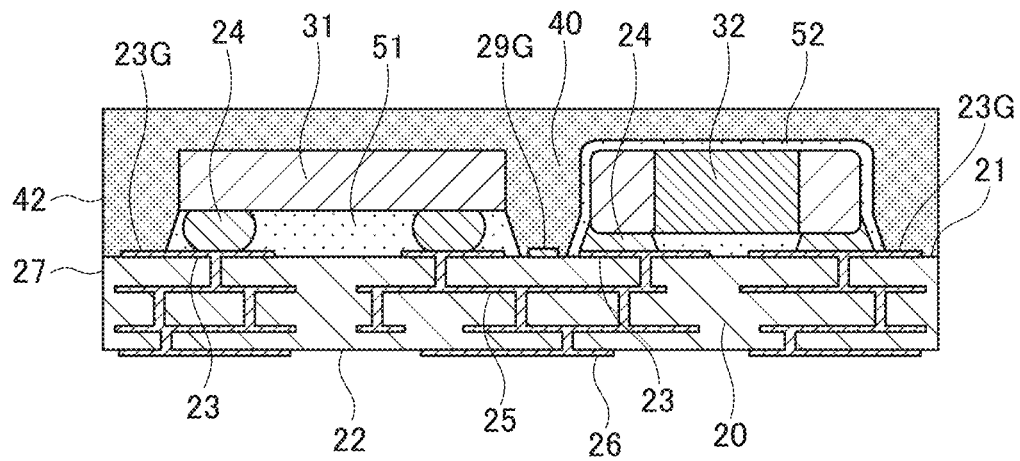
FIG. 13 is a cross-sectional view illustrating a configuration of an electronic circuit package according to a sixth embodiment of the present invention.

FIG. 13 is a cross-sectional view illustrating the configuration of an electronic circuit package 16 according to the sixth embodiment of the present invention.

As illustrated in FIG. 13, the electronic circuit package 16 according to the present embodiment differs from the electronic circuit package 11 according to the first embodiment in that an independent power supply pattern 29G is additionally provided on the surface 21 of the substrate 20. Other configurations are the same as those of the electronic circuit package 11 according to the first embodiment, so the same reference numerals are given to the same elements, and overlapping description will be omitted.

The power supply pattern 29G is a dedicated pattern for applying a fixed potential to the composite molding member 40. The power supply pattern 29G is not connected to the land patterns 23 and wirings on the upper surface 21 of the substrate 20 but independently provided. The power supply pattern 29G is applied, through the internal wiring 25 formed inside the substrate 20, with a fixed potential same as that applied to the power supply pattern 23G. As exemplified in the present embodiment, as a power supply pattern for applying a fixed potential to the composite molding member 40, not only the power supply pattern 23G led out from the land pattern 23, but also the independent dedicated power supply pattern 29G can be used. With this configuration, it is possible to make the potential (typically, a ground potential) of the composite molding member 40 more stable.

<Seventh Embodiment>

Figure 14:
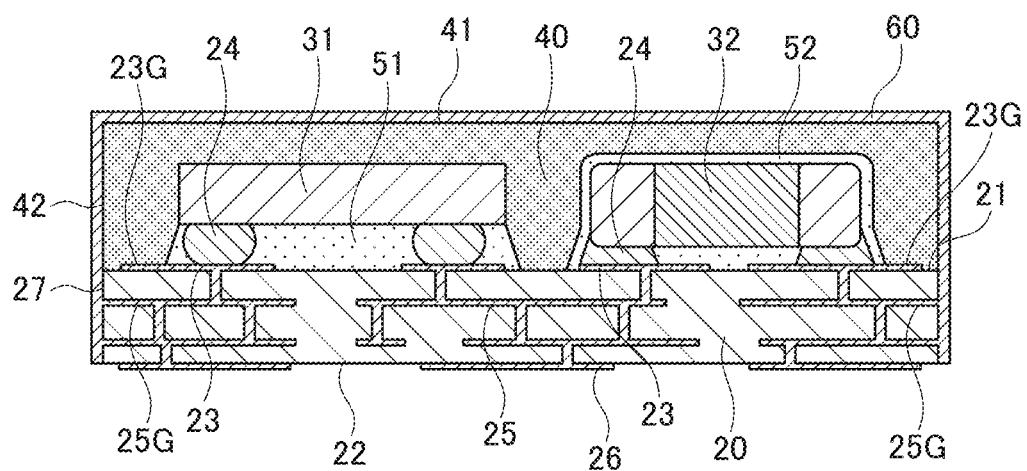
FIG. 14 is a cross-sectional view illustrating a configuration of an electronic circuit package according to a seventh embodiment of the present invention.

FIG. 14 is a cross-sectional view illustrating the configuration of an electronic circuit package 17 according to the seventh embodiment of the present invention.

As illustrated in FIG. 14, the electronic circuit package 17 according to the present embodiment differs from the electronic circuit package 11 according to the first embodiment in that a metal film 60 is additionally formed so as to cover the upper and side surfaces 41 and 42 of the composite molding member 40 and the side surface 27 of the substrate 20. To the side surface 27 of the substrate 20, the power supply pattern 25G is exposed, and the exposed power supply pattern 25G contacts the metal film 60. Other configurations are the same as those of the electronic circuit package 11 according to the first embodiment, so the same reference numerals are given to the same elements, and overlapping description will be omitted.

The metal film 60 serves as an electromagnetic shielding as well as the composite molding member 40 and is preferably mainly composed of at least one metal selected from a group consisting of Au, Ag, Cu, and Al. The metal film 60 preferably has a resistance as low as possible and most preferably uses Cu in terms of cost. It is necessary that the resistivity of the metal film 60 is lower than at least the resistivity of the composite molding member 40. An outer surface of the metal film 60 is preferably covered with an anticorrosive metal such as SUS, Ni, Cr, Ti, or brass or an antioxidant film made of a resin such as an epoxy resin, a phenol resin, an imide resin, an urethane resin, or a silicone resin. The reason for this is that the metal film 60 undergoes oxidative deterioration by an external environment such as heat or humidity; and, therefore, the aforementioned treatment is preferable to suppress and prevent the oxidative deterioration. A formation method for the metal film 60 may be appropriately selected from known methods, such as a sputtering method, a vapor-deposition method, an electroless plating method, an electrolytic plating method. Before formation of the metal film 60, pretreatment for enhancing adhesion, such as plasma treatment, coupling treatment, blast treatment, or etching treatment, may be performed. As a base of the metal film 60, a high adhesion metal film such as a titanium film, a chromium film, or an SUS film may be formed thinly in advance.

As described above, the electronic circuit package 17 according to the present embodiment includes the metal film 60 connected to the power supply pattern 25G, so that it is possible to make the potential (typically, a ground potential) of the composite molding member 40 more stable than in the electronic circuit package 11 according to the first embodiment.

<Eighth Embodiment>

Figure 15:
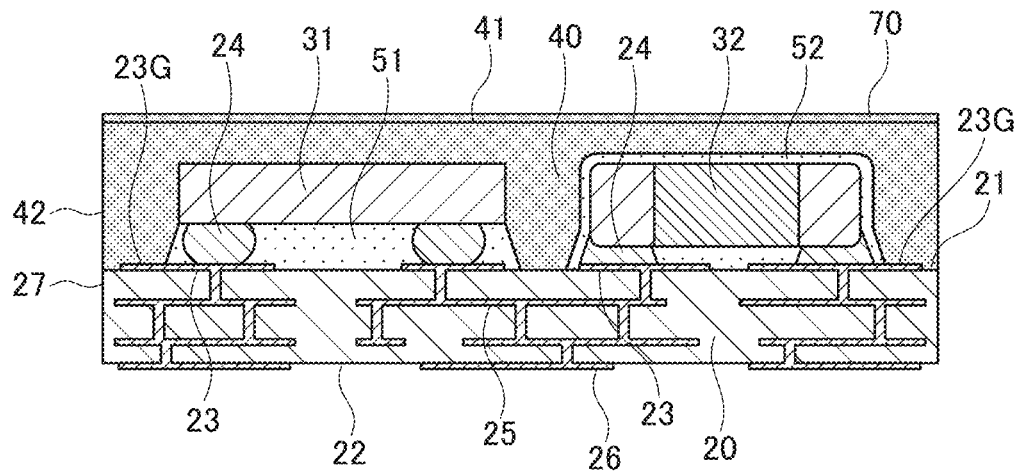
FIG. 15 is a cross-sectional view illustrating a configuration of an electronic circuit package according to an eighth embodiment of the present invention.

FIG. 15 is a cross-sectional view illustrating the configuration of an electronic circuit package 18 according to the eighth embodiment of the present invention.

As illustrated in FIG. 15, the electronic circuit package 18 according to the present embodiment differs from the electronic circuit package 11 according to the first embodiment in that a magnetic film 70 is additionally formed so as to cover the upper surface 41 of the composite molding member 40. Other configurations are the same as those of the electronic circuit package 11 according to the first embodiment, so the same reference numerals are given to the same elements, and overlapping description will be omitted.

The magnetic film 70 is a film formed of a composite magnetic material in which magnetic fillers are dispersed in a thermosetting resin material, a thin film formed of a soft magnetic material or a ferrite, or a foil or a bulk sheet and serves as a second magnetic shield. The effective permeability of the magnetic film 70 needs to be higher than that of the composite molding member 40 and is preferably twice or more higher than it.

When a film formed of a composite magnetic material is selected as the magnetic film 70, an epoxy resin, a phenol resin, a silicone resin, a diallyl phthalate resin, a polyimide resin, an urethane resin, and the like may be used as the thermosetting resin material, and the magnetic film 70 can be formed by using a thick-film formation method such as a printing method, a molding method, a slit nozzle coating method, a spray method, a dispensing method, an injection method, a transfer method, a compression molding method, or a lamination method using an uncured sheet-like resin. Using the thermosetting resin material can enhance reliability required for electronic circuit packages such as heat resistance, insulating performance, impact resistance, falling resistance, and the like.

As the magnetic filler, a ferrite or a soft magnetic metal is preferably used, and a soft magnetic metal having a high bulk permeability is more preferably used. As the ferrite or soft magnetic metal, one or two or more metals selected from a group consisting of Fe, Ni, Zn, Mn, Co, Cr, Mg, Al, and Si and oxides thereof may be exemplified. As specific examples, a ferrite such as an Ni—Zn ferrite, an Mn—Zn ferrite, an Ni—Cu—Zn ferrite, a permalloy (Fe—Ni alloy), a super permalloy (Fe—Ni—Mo alloy), a sendust (Fe—Si—Al alloy), an Fe—Si alloy, an Fe—Co alloy, an Fe—Cr alloy, an Fe—Cr—Si alloy, an Fe—Ni—Co alloy, and Fe, and the like may be exemplified. The shape of the magnetic filler is not particularly limited; however, it may be formed into a spherical shape for a high filling level, and fillers having a plurality of different particle size distributions may be blended or combined for a densest filling structure. In order to maximize a shield effect by a permeability real component and a thermal conversion effect of a loss by a permeability imaginary component, it is more preferable to form the magnetic filler by making flat powder having an aspect ratio of 5 or more orientate.

The surface of the magnetic filler is insulation-coated by an oxide of a metal such as Si, Al, Ti, or Mg, or an organic material for enhancing fluidity and adhesion. For the insulating coating, an oxide film may be formed by coating a thermosetting material on the surface of the magnetic filler or dehydration reaction of a metal alkoxide, and formation of a silicon oxide coating film is most preferable. It is more preferable to apply an organofunctional coupling treatment on the coating film thus formed.

The composite magnetic material can be formed on the upper surface 41 of the composite molding member 40 using a known method such as a printing method, a molding method, a slit nozzle coating method, a spray method, a dispensing method, or a lamination method using an uncured sheet-like resin.

When the thin film formed of a soft magnetic material or a ferrite is selected as the magnetic film 70, one or two or more metals selected from a group consisting of Fe, Ni, Zn, Mn, Co, Cr, Mg, Al, and Si and oxides thereof may be used. In this case, the magnetic film 70 can be formed on the upper surface 41 of the composite molding member 40 by using a plating method, a spray method, an AD method, and a thermal spraying method, as well as a thin-film formation method such as a sputtering method or a vapor-deposition method. In this case, the material for the magnetic film 70 may be appropriately selected based on a required permeability and frequency; however, in order to enhance a shield effect on a lower frequency side (kHz to 100 MHz), an alloy of Fe—Co, Fe—Ni, Fe—Al, or Fe—Si is most preferably used. On the other hand, in order to enhance a shield effect on a higher frequency side (50 to several hundreds of MHz), a ferrite film formed of NiZn, MnZn, or NiCuZn, or Fe is most preferably used.

When a foil or a bulk sheet is used as the magnetic film 70, it is possible to directly form the magnetic film 70 consisting of a foil or a bulk sheet on the upper surface 41 of the composite molding member 40 by previously setting the foil or bulk sheet in a mold for forming the composite molding member 40.

Figure 16:
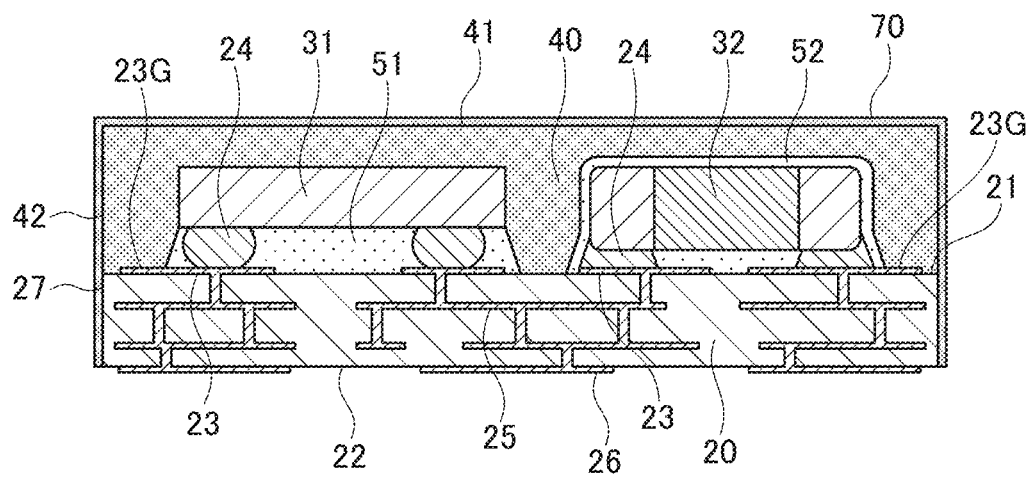
FIG. 16 is a cross-sectional view illustrating a configuration of an electronic circuit package according to a modification of the eighth embodiment of the present invention.

As described above, in the electronic circuit package 18 according to the present embodiment, the magnetic film 70 having a higher permeability than that of the composite molding member 40 is formed on the upper surface 41 of the composite molding member 40, so that magnetic shielding characteristics can be further enhanced. Further, as exemplified by an electronic circuit package 18A shown in FIG. 16 according to a modification, the magnetic film 70 may be used to cover not only the upper surface 41 of the composite molding member 40, but also the side surface 42 of the composite molding member 40 and/or the side surface 27 of the substrate 20. With this configuration, it is possible to further enhance magnetic shielding characteristics in the side surface direction.

<Ninth Embodiment>

Figure 17:
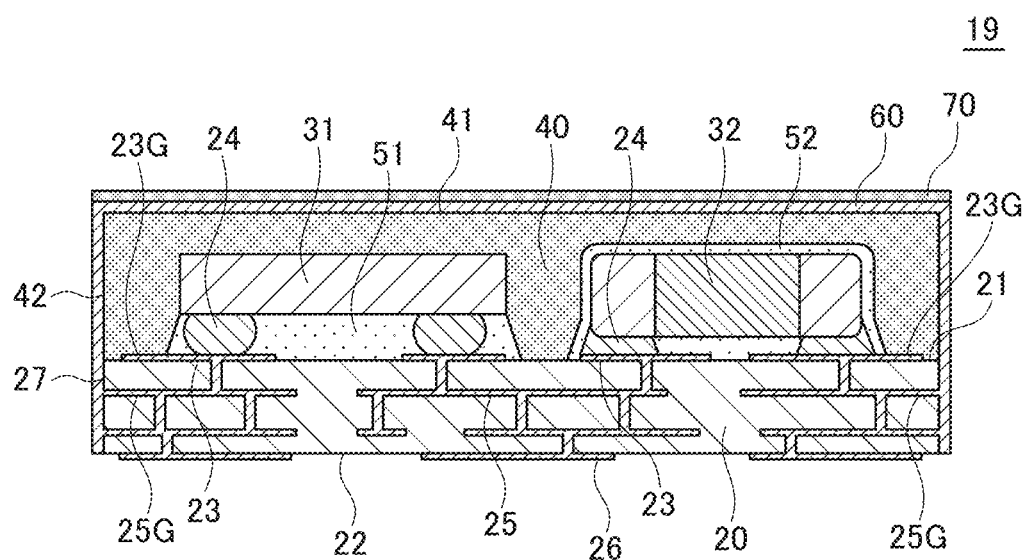
FIG. 17 is a cross-sectional view illustrating a configuration of an electronic circuit package according to a ninth embodiment of the present invention.

FIG. 17 is a cross-sectional view illustrating the configuration of an electronic circuit package 19 according to the ninth embodiment of the present invention.

As illustrated in FIG. 17, the electronic circuit package 19 according to the present embodiment differs from the electronic circuit package 17 according to the seventh embodiment in that the magnetic film 70 is additionally formed so as to cover the upper surface 41 of the composite molding member 40 through the metal film 60. Other configurations are the same as those of the electronic circuit package 17 according to the seventh embodiment, so the same reference numerals are given to the same elements, and overlapping description will be omitted.

In the electronic circuit package 19 according to the present embodiment, the surface of the composite molding member 40 serving as an electromagnetic shield and a magnetic shield is covered with the metal film 60 serving as an electromagnetic shield and the magnetic film 70 serving as a magnetic shield, so that it is possible to further enhance electromagnetic shielding characteristics and magnetic shielding characteristics.

While the preferred embodiments of the present invention have been described, the present invention is not limited thereto. Thus, various modifications may be made without departing from the gist of the invention, and all of the modifications thereof are included in the scope of the present invention.

EXAMPLES

First filler F1 having a median diameter (D50) of 10 μm and second filler F2c having a median diameter (D50) of 0.7 μm were prepared. The first filler F1 was formed of an Invar material with 64 wt. % of Fe and 36 wt. % of Ni, and an Ag having 50 nm thickness was plated on the surface thereof. The second filler F2c was formed of a heat resistant resin, and Ag having a thickness of 80 nm was plated on the surface thereof.

Then, a biphenyl type epoxy resin, a phenol novolac type curing agent, and a catalyst (imidazole) were dissolved in butyl carbitol to prepare a binder. The above first filler F1 and second filler F2c were put into the binder, followed by stirring and kneading in a kneader, to obtain a pasty composite sealing material. The blending ratios of the first filler F1, second filler F2c, and binder in the composite sealing material were 50 vol. %, 25 vol. %, and 25 vol. %, respectively.

Then, samples 1 to 3 having the same structure as that of the electronic circuit package 11 illustrated in FIG. 1 were actually produced. As the substrate 20, a multilayer resin substrate having a planar size of 8 mm×8 mm and a thickness of 0.3 mm was used. As the composite molding member 40, the above composite sealing material was used to form the composite molding member 40 on the upper surface 21 of the substrate 20 by a vacuum printing method, followed by heating at 100° C. for four hours for removal of solvent and then post-curing at 180° C. for three hours.

After the post-curing, the upper surface 41 of the composite molding member 40 was ground by a grinder for thickness adjustment. The thicknesses (t) of the composite molding member 40 at a portion above the highest electronic component were set to 100 μm, 200 μm, and 300 μm in the samples 1, 2, and 3, respectively.

As a comparative example, in place of the above composite molding member, a general molding material having neither magnetism nor conductivity was used for molding, and then a Cu film of a 6 μm thickness was formed on the surface of the obtained molding member by a sputtering method, whereby a comparative sample was obtained. The Cu film was connected to a ground pattern.

Then, the above samples were each reflow-mounted on a characteristic evaluation substrate, and a neighboring magnetic field measuring apparatus was used to measure a noise attenuation amount for evaluation of shielding characteristics. The results are illustrated in FIG. 18.

Figure 18:
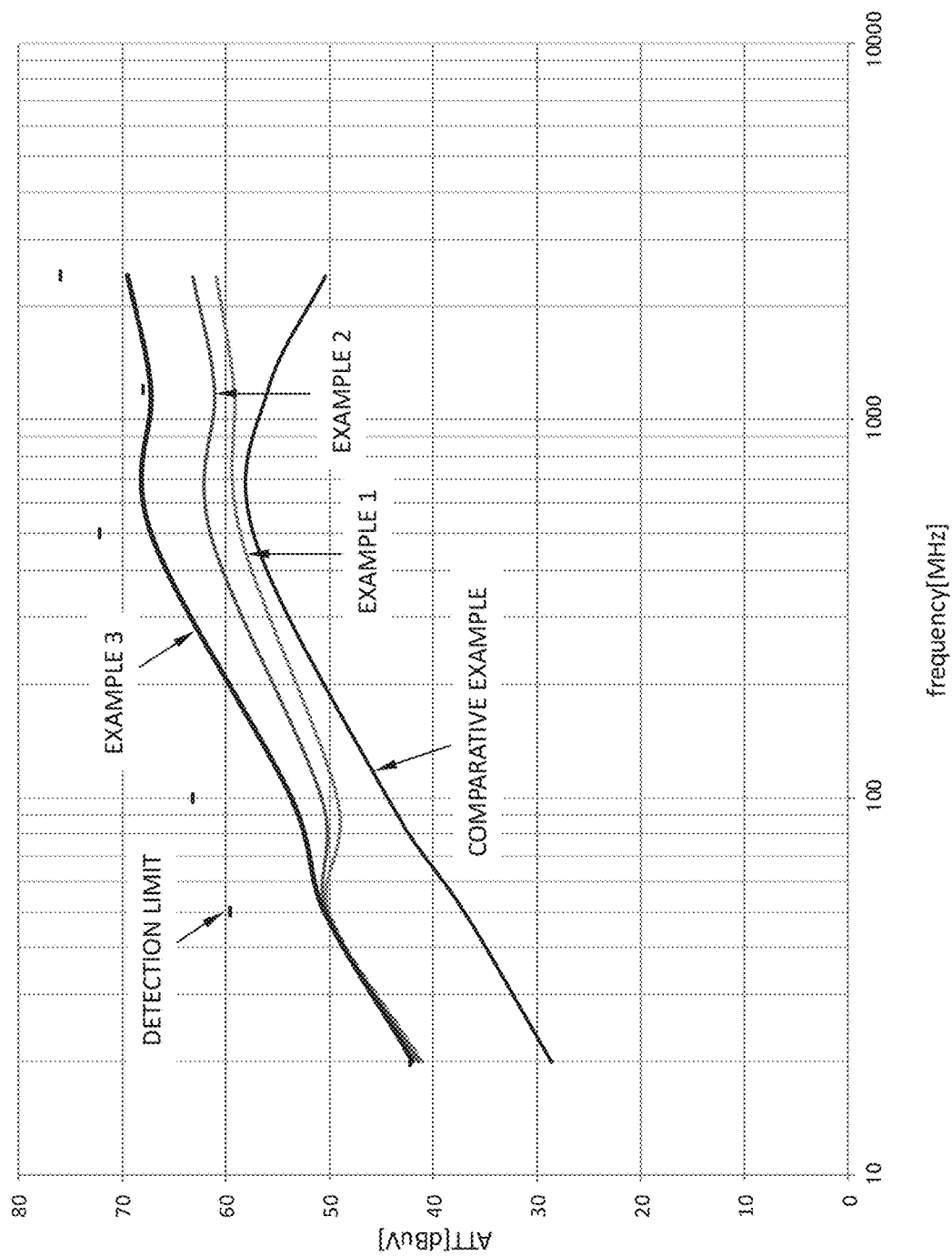
FIG. 18 is a graph indicating measurement results of examples.

As illustrated in FIG. 18, it is confirmed that the examples 1 to 3 exhibit a larger noise attenuation amount than the comparative sample in a frequency band of 20 MHz to 2.4 GHz. Particularly, in a frequency band of 20 MHz to 50 MHz, the examples 1 to 3 equally exhibit a larger noise attenuation amount than the comparative sample. Further, in a frequency band exceeding 50 MHz, the larger the thickness of the composite molding member 40 is, the larger the noise attenuation amount becomes, and the sample 3 exhibits a noise attenuation amount close to the measurement limit near 1 GHz.

What is claimed is:
1. An electronic circuit package comprising:
a substrate having a power supply pattern;
an electronic component mounted on a surface of the substrate;
a composite molding member having conductivity that covers the surface of the substrate so as to embed the electronic component, the composite molding member being connected to the power supply pattern, the composite molding member including a resin material and a first filler blended in the resin material, the first filler containing 32 to 39 wt. % of a metal material composed mainly of Ni in Fe; and
a metal coating covering a surface of the first filler, the metal coating having a higher conductivity than that of the first filler.

2. The electronic circuit package as claimed in claim 1, wherein the composite molding member further includes a second filler having a smaller size than that of the first filler.

3. The electronic circuit package as claimed in claim 2, wherein a surface of the second filler is covered with a metal coating.

4. The electronic circuit package as claimed in claim 2, wherein the second filler is formed of a magnetic material.

5. The electronic circuit package as claimed in claim 2, wherein the second filler is formed of a conductive material.

6. The electronic circuit package as claimed in claim 2, wherein the second filler is formed of an insulating material.

7. The electronic circuit package as claimed in claim 2, wherein a blending ratio of the first and second fillers in the composite molding member is equal to or higher than 50 vol. % and equal to or lower than 85 vol. %.

8. The electronic circuit package as claimed in claim 2, wherein a blending ratio of the first filler to a total amount of the first and second fillers is equal to or higher than 50 vol. % and equal to or lower than 99 vol. %.

9. The electronic circuit package as claimed in claim 1, further comprising an insulating coating that insulates the electronic component and its terminal electrode from the composite molding member.

10. The electronic circuit package as claimed in claim 1, wherein the composite molding member contacts the power supply pattern exposed to the surface of the substrate.

11. The electronic circuit package as claimed in claim 10, wherein the composite molding member further contacts the power supply pattern exposed to a side surface of the substrate.

12. The electronic circuit package as claimed in claim 1, wherein the composite molding member contacts the power supply pattern exposed to a side surface of the substrate.

13. The electronic circuit package as claimed in claim 1, wherein the substrate includes a side surface having a side surface upper part and a side surface lower part protruding from the side surface upper part,
wherein the power supply pattern is exposed to the side surface upper part of the substrate, and
wherein the composite molding member covers the side surface upper part of the substrate without covering the side surface lower part of the substrate.

14. The electronic circuit package as claimed in claim 1, further comprising a metal film that covers the composite molding member, the metal film having higher conductivity than that of the composite molding member.

15. The electronic circuit package as claimed in claim 1, further comprising a magnetic film that covers the composite molding member, the magnetic film having higher permeability than that of the composite molding member.

16. The electronic circuit package as claimed in claim 1, wherein the metal material further includes 0.1 to 8 wt. % of Co relative to a total weight of the first filler.

17. The electronic circuit package as claimed in claim 1, wherein a thermal expansion coefficient of the composite molding member is equal to or lower than 15 ppm/° C.

18. The electronic circuit package as claimed in claim 1, wherein a thickness of the composite molding member at a portion above the electronic component is equal to or larger than 50 μm.

19. The electronic circuit package as claimed in claim 18, wherein the thickness of the composite molding member at a portion above the electronic component is equal to or larger than 100 μm and equal to or smaller than 300 μm.

20. An electronic circuit package comprising:
a substrate having a power supply pattern;
an electronic component mounted on a surface of the substrate; and
a composite molding member having conductivity that covers the surface of the substrate so as to embed the electronic component, the composite molding member being connected to the power supply pattern, the composite molding member including:
a resin material;
a first filler blended in the resin material, the first filler containing 32 to 39 wt. % of a metal material composed mainly of Ni in Fe, and
a second filler blended in the resin material, the second filler having a smaller size than that of the first filler.

21. An electronic circuit package comprising:
a substrate having a power supply pattern;
an electronic component mounted on a surface of the substrate; and
a composite molding member having conductivity that covers the surface of the substrate so as to embed the electronic component, the composite molding member being connected to the power supply pattern,
wherein the power supply pattern is exposed to the surface of the substrate and wherein the composite molding member contacts the power supply pattern and includes a resin material and a first filler blended in the resin material, the first filler containing 32 to 39 wt. % of a metal material composed mainly of Ni in Fe.

22. An electronic circuit package comprising:
a substrate having a power supply pattern;
an electronic component mounted on a surface of the substrate; and
a composite molding member having conductivity that covers the surface of the substrate so as to embed the electronic component, the composite molding member being connected to the power supply pattern,
wherein the composite molding member includes a resin material and a first filler blended in the resin material, the first filler containing 32 to 39 wt. % of a metal material that is composed mainly of Ni in Fe and that includes 0.1 to 8 wt. % of Co relative to a total weight of the first filler.

23. An electronic circuit package comprising:
a substrate having a power supply pattern;
an electronic component mounted on a surface of the substrate; and
a composite molding member having conductivity that covers the surface of the substrate so as to embed the electronic component, the composite molding member being connected to the power supply pattern and having a thermal expansion coefficient equal to or lower than 15 ppm/° C.,
wherein the composite molding member includes a resin material and a first filler blended in the resin material, the first filler containing 32 to 39 wt. % of a metal material composed mainly of Ni in Fe.

* * * * *